Jan. 6, 1970 R. C. VOIGE 3,488,554

LINEARITY CORRECTED SWEEP CIRCUIT

Filed Feb. 17, 1967

Inventor
RAYMOND C. VOIGE

BY Mueller, Aichele & Rauner

ATTYS.

United States Patent Office 3,488,554

Patented Jan. 6, 1970

3,488,554

LINEARITY CORRECTED SWEEP CIRCUIT

Raymond C. Voige, Park Ridge, Ill., assignor to Motorola, Inc., Franklin Park, Ill., a corporation of Illinois Filed Feb. 17, 1967, Ser. No. 616,979
Int. Cl. H01j 29/76
U.S. Cl. 315—29 6 Claims

ABSTRACT OF THE DISCLOSURE

A circuit consisting of a transistor with its input coupled to a sawtooth sweep system and a capacitor connected between its output and the sawtooth sweep system. The transistor charges the capacitor during retrace. During trace the capacitor discharges an opposing voltage through the sawtooth forming capacitors of the sawtooth sweep system which distorts the sawtooth waveform in such a manner that only a small amount of feedback is required to produce a highly linear and stable sawtooth waveform through the winding of a deflection yoke of a television receiver.

BACKGROUND OF THE INVENTION

In time base sweep systems a sawtooth waveform of high linearity is quite desirable. This is particularly true in television receivers where highly linear sawtooth current waves are required in the deflection yoke windings of the cathode ray tube to achieve an undistorted picture. Conventionally, television sweep systems employ an inductive coupling component, such as a transformer, between the sweep power amplifier and the deflection yoke winding to prevent the flow of direct current through the deflection winding while still coupling the trace portion of the sawtooth wave to the winding. This inductive coupling component, however, introduces distortion in the trace portion of the sawtooth, thereby distorting the picture. Additional trace distortion is introduced through the use of transistors in the sweep system. A conventional method of reducing the effect of the aforementioned types of distortion is by the inclusion of a feedback network which feeds back an integrated waveform to the sweep generator to distort the trace portion of the sawtooth in a planned fashion and thereby compensates for the distortion later introduced by transistor and transformer circuits. However, excessive feedback introduces instability in the sweep system. So there is a practical limit to the amount of feedback that can be used to achieve linearity and the twin goals of linearity and stability must be balanced.

SUMMARY OF THE INVENTION

It is, therefore, an object of the present invention to provide an improved sawtooth sweep system for developing and applying a linear sawtooth sweep to the winding of a deflection yoke.

Another object of the present invention is to provide a highly stable sawtooth sweep system which requires very little feedback for good linearity.

A further object of the invention is to provide a new circuit to a vertical deflection system utilizing transistors which compensates for the distortion introduced by the output transistors, the output transformer and the deflection coil.

A still further object is to provide a transistorized vertical deflection system which produces a highly stable, linear sawtooth current waveform for the vertical deflection coil of a television receiver.

One embodiment of this invention provides an improved sawtooth waveform sweep system having an AC coupled wave shaping circuit, the output of which is connected to the sweep capacitors of a sawtooth sweep circuit. The wave shaping circuit acts in conjunction with the conventional feedback network to shape the sawtooth voltage waveform to compensate for the inherent non-linearities of output transistor and transformer circuits. The use of the AC coupled wave shaping network does not require much feedback to shape the sawtooth waveform to achieve good linearity and therefore the system produces a highly linear and stable sawtooth.

DETAILED DESCRIPTION

Figures 1, 2:
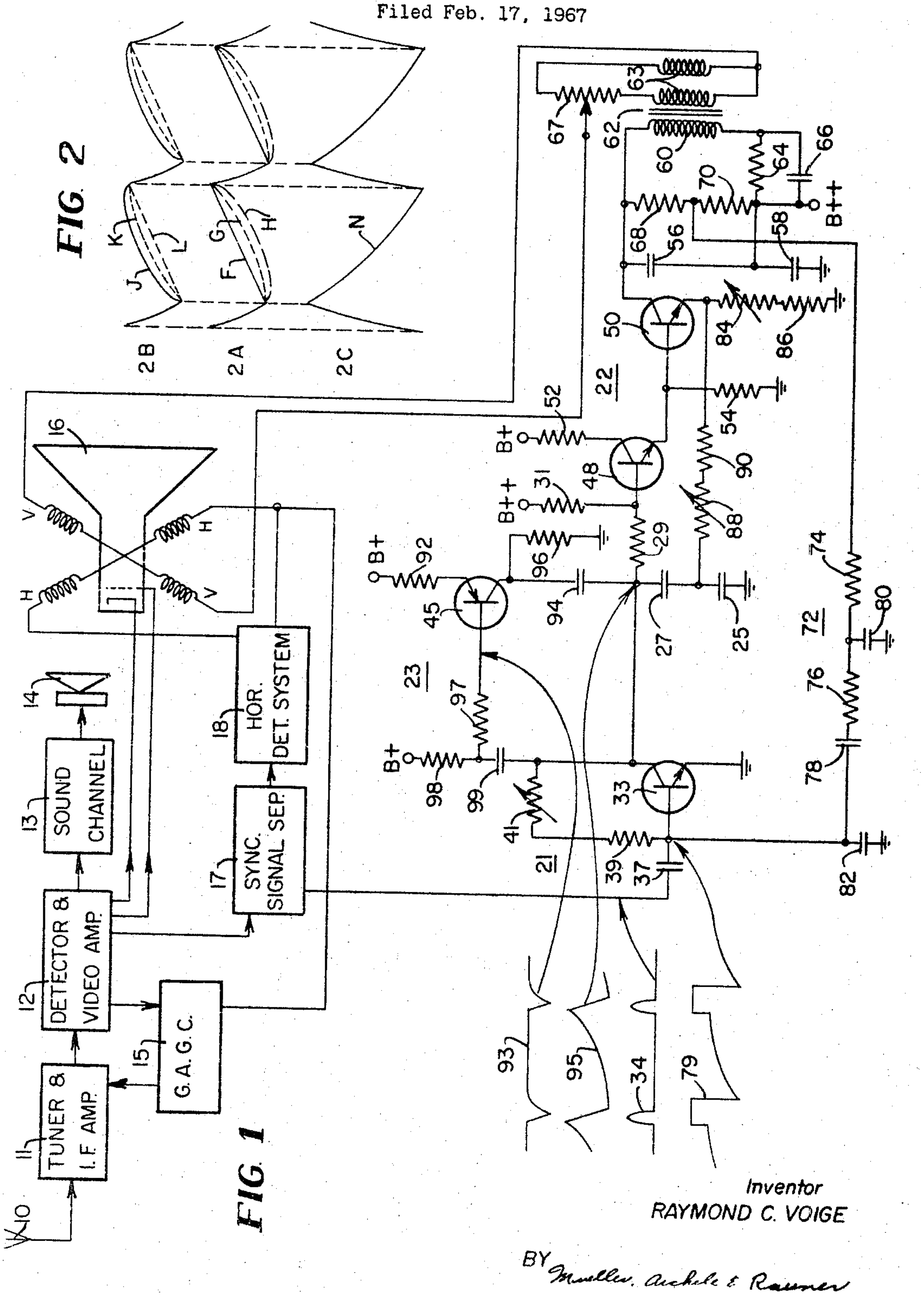
FIG. 1 is a partial block and schematic diagram of a vertical deflection system of a television receiver embodying this invention.
FIG. 2 illustrates certain voltages and current waveforms referred to in explaining this invention.

Referring now to FIG. 1, the illustrated television receiver operates in the following manner. Radio frequency television waves are picked up by antenna 10 and sent to tuner and IF amplifier 11. The tuner selects the desired signal frequencies and converts the signal to a fixed frequency which is amplified by an IF amplifier and then sent to detector and video amplifier 12. The detector demodulates the composite video signal, which has horizontal (line) and vertical (frame) synchronizing signals, video frequency components, and a modulated sound carrier. The demodulated television signal is then applied to the video amplifier which has four outputs. The first output is a demodulated audio signal which is sent through the sound channel 13, consisting of a sound amplifier, a detector and an audio frequency amplifier, in order to drive loudspeaker 14. The second output is applied to a gated automatic gain control circuit 15 in order to control the gain of tuner and the IF amplifier 11. The third output is detected and amplified by video signals which are applied to the cathode of cathode ray tube 16 for display of the picture. The fourth output is applied to synchronizing signal separator 17 which separates the horizontal and vertical synchronizing components from the composite video signal. The horizontal synchronizing signal is applied to horizontal deflection system 18 which develops and applies a sawtooth current waveform to the horizontal deflection winding which is mounted on the neck of cathode ray tube 16 and is designated by the letters HH. The vertical synchronizing signal is coupled to the vertical deflection system as illustrated by the schematic portion of FIG. 1. The vertical deflection system consists of sawtooth voltage generator 21, sawtooth amplifier 22, and correction circuit 23. In response to the application of the vertical synchronizing signal to its input, the sawtooth voltage generator 21 generates and applies a sawtooth voltage waveform to sawtooth amplifier 22 which amplifies and applies a sawtooth current waveform to the vertical deflection coil VV which is mounted on the neck of cathode ray tube 16. The horizontal and vertical deflection systems synchronize the presentation of the picture on the face of the cathode ray tube with scanning by the television camera of the scene being televised. Correction circuit 23 provides a corrective voltage to sawtooth voltage generator 21 to correct for non-linearities in the vertical deflection system and thereby minimize picture distortion.

Referring to the schematic portion of FIG. 1 and the wave shapes shown in FIG. 2, correction circuit 23 of this invention is connected to a conventional sawtooth forming system consisting of sawtooth voltage generator 21 and sawtooth amplifier 22.

The sawtooth generator 21 includes two serially connected charging capacitors 25 and 27 which charge from a reference potential through resistors 29 and 31 toward a positive potential B++. The capacitors 25 and 27 are shunted by the emitter-collector electrodes of NPN control transistor 33, which contains base, emitter and collector electrodes. Positive-going synchronizing pulses 34 from synchronizing signal separator 17, are coupled through capacitor 37 to the base of transistor 33. The base of transistor 33 is also connected to a feedback network which will be explained later. The base of transistor 33 is further connected through serially connected resistor 39 and HOLD (frequency) control potentiometer 41 to the collector in order to control the frequency of sawtooth generator 21. The collector is connected through serially connected resistors 29 and 31 to the source of power B++ for supplying voltage thereto. Coupled to the collector is correction circuit 23, which introduces a parabolic correction voltage in order to predistort the sawtooth voltage waveform to compensate for subsequently induced circuit distortion. The correction circuit 23 will be explained in detail later on. The predistorted sawtooth voltage output is taken from the collector of transistor 33 and coupled through resistor 29 to the base of driver transistor 48 in sawtooth amplifier 22.

Sawtooth amplifier 22 includes NPN transistors 48 and 50 each having base, emitter and collector electrodes. The collector of driver transistor 48 is connected through resistor 52 to a positive potential B+. The emitter of driver transistor 48 is connected through resistor 54 to the reference potential. The output of driver transistor 48 is taken from the emitter and connected to the base of output transistor 50 which supplies the power to drive the vertical deflection coil.

The collector of output transistor 50 is coupled through serially connected capacitors 56 and 58 to the reference potential. The output of transistor 50 is developed across the primary winding 60 of transformer 62 and transformer-coupled to bifilar secondary windings 63. One side of each of the bifilar secondary windings 63 is connected together and to one side of the vertical deflection winding. The other side of each of the bifilar windings is connected to separate ends of vertical centering potentiometer 67. The movable arm of potentiometer 67 is connected to the other side of the vertical deflection winding. The primary winding 60 is connected in series with resistor 64 and across capacitor 56. Across resistor 64 is decoupling capacitor 66. The collector is connected through resistors 68 and 70 to the B++ potential. Resistors 68 and 70 are connected across capacitor 56. A portion of the output from the collector circuit is taken from the junction of resistors 68 and 70 and coupled through feedback network 72, which includes serially connected resistors 74 and 76 and capacitor 78, to the base of transistor 33. Filter capacitor 82 is connected between the base of transistors 33 and the reference potential. The junction of resistors 74 and 76 is connected to a reference potential through filter capacitor 80.

The emitter electrode of output transistor 50 is connected through size potentiometer 84 and resistor 86 to the reference potential in order to control the amplitude of the output sawtooth waveform. A feedback network consisting of serially-connected linearity control potentiometer 88 and resistor 90 is connected from the emitter of output transistor 50 to the junction of capacitors 25 and 27 in order to improve the linearity of the sawtooth wave shape.

Correction circuit 23 consists of PNP switching transistor 45 which has base, emitter and collector electrodes. The emitter is connected through resistor 92 to the B+ potential. The collector of transistor 45 is connected through correction capacitor 94 to the junction of resistor 29 and capacitor 27 for coupling the correction voltage to the sawftooth capacitors 27 and 25. The collector is also connected through resistance 96 to the reference potential. The base is connected through serially connected resistors 97 and 98 to the B+ potential. The base is also connected through serially connected resistor 97 and capacitor 99 to the collector of transistor 33 in order to receive a voltage to start the conduction of transistor 45 and thereby produce the correction voltage.

Considering now the operation of the sawtooth generator 21 and the sawtooth amplifier 22, it shall initially be assumed that charging capacitors 25 and 27 are discharged and that the base of transistor 33 is negative with respect to the emitter due to the negative charge across capacitor 78. Transistor 33 is therefore cut off and capacitors 25 and 27 now charge toward the B++ potential through resistors 29 and 31, in order to form the sawtooth wave shape during the trace interval. The sawtooth voltage is developed at the collector of transistor 33 and coupled through resistor 29 to the base of driver transistor 48 for further amplification. The output from transistor 48 is coupled to the base of output transistor 50 which amplifies the sawtooth waveform and provides a sawtooth current through the primary 60 of transformer 62. The sawtooth waveform is transformer-coupled across the bifilar secondary winding 63 for supplying the sawtooth sweep current to the vertical deflection coil VV. A frequency or hold control 41 adjusts the self-oscillating frequency of the system. At the end of the trace interval capacitor 78 which had been discharging through resistors 39, 41, 29 and 31 toward the B++ potential has discharged enough to raise the base potential of transistor 33 to approximately .6 of a volt. This causes transistor 33 to barely start conducting. The conduction of transistor 33 starts the rapid discharge of charging capacitors 27 and 25 as shown in FIG. 2A. When transistor 33 first starts conducting, the collector of transistor 33 drops in potential and a negative-going voltage is coupled from the collector of transistor 33 through resistor 29 to the base of driver transistor 48, decreasing the conduction of the driver through resistor 54. This causes the base potential of transistor 50 to go in a negative direction and output transistor 50 starts to cut off. The collector of output transistor 50 starts to rise to the B++ potential. A small portion of this positive-going change in voltage is coupled from the junction of resistors 68 and 70 through feedback network 72 to the base of transistor 33 causing transistor 33 to conduct more heavily. The action is cumulative and transistors 48 and 50 are rapidly cut off while transistor 33 conducts heavily. With no further current being furnished to the deflection coil, the magnetic field that has been built up in the deflection coil rapidly collapses and induces a large positive-going retrace pulse back into the primary winding 60 of transformer 62. A portion of this large retrace pulse is coupled back from the junction of resistors 68 and 70 in the collector circuit of output transistor 50 through feedback network 72, to the base of transistor 33. This large positive pulse drives transistor 33 to saturation and keeps transistor 33 conducting for the period of the retrace which is determined by the inductance-resistance time constant of transformer 62 and resistors 68, 70 and 64. For the duration of the pulse, transistor 33 draws heavy base current which charges the base side of capacitor 78 negatively through resistors 76, 74 and 70. At the termination of the retrace pulse this negative potential across capacitor 78 cuts off transistor 33 and maintains it in a cutoff condition while capacitor 78 discharges through resistors 39, 41, 29 and 31 toward the B++ potential. See waveshape 79 for the change in the base voltage of the transistor 33 during retrace and trace portions of the sawtooth. During the time that transistor 33 is cut off capacitors 25 and 27 again charge toward the B++ potential. It is, therefore, evident that the free-running frequency of the vertical deflection circuit is determined by the time it takes capacitor 78 to discharge to the point where transistor 33 begins to conduct and discharge capacitors 25 and 27 again.

The natural self-oscillating frequency of the above circuit is lower than the frequency of the incoming positive synchronizing pulse 34, which is coupled through capacitor 37 to the base of transistor 33 and causes transistor 33 to start conducting before capacitor 78 has discharged sufficiently to bring transistor 33 out of cutoff without the application of the synchronizing pulse. The frequency of the synchronizing pulses, which is the vertical scanning rate, is standardized at 60 cycles per second.

The linearity of the sawtooth voltage waveform that is developed across capacitors 25 and 27 is dependent upon the resistance-capacitance (RC) time constant of capacitors 25 and 27 and resistors 29 and 31 on charge. Resistor 31 has a sufficiently high resistance that a relatively linear sawtooth is produced at the top of capacitor 27 as viewed in FIG. 1. The wave shape is shown by the solid line F of FIG. 2A. Another form of non-linearity that distorts the sawtooth waveform is due to the imperfect transistor characteristics inherent in transistors, in this case transistors 48 and 50. A still further source of non-linearity is due to the inductive effect of the transformer 62 and the vertical deflection coil VV. The above described sources of non-linearity would distort the linear sawtooth represented by the solid line F of FIG. 2A and produce the distorted sawtooth through the deflection coil that is shown by the solid line J of FIG. 2B. To compensate, at least in part, for the aforementioned forms of non-linearities which distort the sawtooth waveform, a feedback network is incorporated. This consists of the serially connected resistor 90 and linearity control potentiometer 88 which are direct coupled between the emitter of transistor 50 and the junction of charging capacitors 25 and 27. A sawtooth waveform is taken from the emitter circuit of transistor 50 and fed back through the feedback network to charging capacitor 25, which integrates the feedback voltage waveshape and adds it to the linear sawtooth voltage, as shown by the dotted line G of FIG. 2A. Linearity control potentiometer 88 controls the amplitude of the sawtooth voltage fed back and thus controls the degree of linearity correction. However, it should be noted at this point that if enough of a sawtooth voltage is fed back to correct for the non-linearities subsequently induced in the sawtooth waveform, the output will be unstable. Therefore, there is a practical limitation upon the linearity setting and the amount of feedback involved. As a result the sawtooth waveform in the deflection coil is still slightly distorted in order to achieve the required stability, as shown by the dotted line K in FIG. 2B.

The invention of this disclosure, as manifested by correction circuit 23, is provided to increase the linearity of the sawtooth current waveform in the vertical deflection coil by preshaping the sawtooth to compensate for the distortion subsequently induced into the sawtooth waveform by transistors 48 and 50 and transformer 62 and the vertical deflection coil VV.

The operation of the correction circuit is as follows. When a vertical synchronizing pulse 34 is injected on the base of transistor 33, transistor 33 starts to conduct and to rapidly discharge capacitors 25 and 27. A negative-going pulse from the collector of transistor 33 is coupled through the differentiating circuit composed of capacitor 99 and resistor 97 to the base of transistor 45 and starts the conduction of transistor 45. At the same time that the conduction of transistor 33 is discharging capacitors 27 and 25 to the reference potential, it is charging capacitor 94. The charge path for capacitor 94 is from the reference potential, through the emitter-collector region of transistor 33, through capacitor 94, through the collector-emitter region of transistor 45, and through resistor 92 to the B+ potential. The RC time constant of capacitor 99 and resistor 98 is such that transistor 45 continues conducting during the retrace time. At the end of the retrace time capacitor 99 has sufficiently discharged through resistor 98 that the base potential 93 goes more positive and cuts off transistor 45. At the termination of the retrace pulse, charging capacitors 25 and 27 are discharged, the collector of transistor 33 is at zero volts potential and transistor 33 is cutoff. When transistor 33 is cut off the capacitors 25 and 27 start charging as mentioned previously. When transistor 45 cuts off capacitor 94 starts discharging through capacitors 27 and 25, which are now charging, to the reference potential and through resistor 96, thereby distorting the sawtooth voltage wave shape. The voltage across capacitor 94 during both charge and discharge is shown by wave shape N in FIG. 2C. The distorted sawtooth voltage 95 wave shape at the collector of transistor 33 is shown by the dashed line H in FIG. 2A, and produces a very linear sawtooth of current through the deflection coil while at the same time producing a highly stable sawtooth waveform. This is shown by the dashed line L in FIG. 2B.

Applicant has disclosed an improved sawtooth sweep system which compensates for circuit induced distortion and provides a very linear sawtooth waveform having good stability for the vertical deflection coil of a television receiver.

What I claim is:

1. In a cathode ray sweep circuit having a sawtooth generating means including first capacitor means, a first charging path connected across the first capacitor means for charging the first capacitor means from a source of potential, means responsive to a charge change of generally sawtooth form on the first capacitor means, and control circuit means to periodically discharge the first capacitor means, the improvement therein comprising a wave shaping circuit for modifying the sawtooth waveform on the first capacitor means, including in combination, second capacitor means, a charging circuit coupled across said second capacitor means and including switching means responsive to a signal from the control circuit means for charging said second capacitor means on discharge of the first capacitor means, and resistor means, independent of the first charging path, connected in series with said second capacitor means, with the series combination of the resistor means and said second capacitor means being connected across the first capacitor means, the first charging path and the charging circuit coupled across the second capacitor means being arranged so that the charge on said second capacitor means algebraically combines with the charge on the first capacitor means obtained from the first charging path in series opposition thereto to modify the sawtooth waveform thereacross.

2. The cathode ray tube sweep circuit of claim 1 wherein the resistor means is connected between one side of said second capacitor means and a reference potential, with a direct connection between the other side of said second capacitor means and the first capacitor means.

3. The cathode ray sweep circuit of claim 1 wherein said switching means includes a transistor having input and output portions, said input portion being connected to the control circuit means, said second capacitor means being connected between said output portion and the control circuit means in order to charge therethrough when said transistor is rendered conductive by a signal applied to said input portion from said control circuit means.

4. The cathode ray sweep circuit of claim 1 wherein the charge change responsive means includes feedback circuit means coupled to the first capacitor means for also modifying the sawtooth waveform thereon in conjunction with said wave shaping circuit to compensate for non-linearities induced by the charge change responsive means.

5. In a cathode ray sweep system including sweep circuit means coupled to charging means for generating a sawtooth wave signal with trace and retrace portions in response to a synchronizing signal, a wave shaping circuit including in combination, switching means having input and output electrodes, coupling means connected in series between the circuit means and said input electrode for transferring a signal to render said switching means conductive during the retrace portion, capacitor means connected in series between the circuit means and said output electrode to be charged upon the conduction of said switching means therethrough during the retrace portion, said capacitor means discharging through said charging means during the trace portion to provide a voltage for modifying the shape of the sawtooth wave signal.

6. In a deflection system including circuit means having an output electrode coupled to capacitor means for generating a sawtooth deflection signal with trace and retrace portions in response to a synchronizing signal, a source of fixed potential coupled to the capacitor means for furnishing a charging current thereto during the trace portion, means coupled to the capacitor means for amplifying the deflection signal and feeding back a portion of the amplified deflection signal to the capacitor means for improving the linearity of the deflection signal, a wave shaping circuit including in combination, transistor means having base, emitter and collector electrodes, bias circuit means coupled to said base and emitter electrodes, capacitor coupling means connected between the output electrode and said base electrode for rendering said transistor means conductive during retrace, resistance means connecting said collector to a reference potential, and correction capacitor means connected between said collector electrode and the output electrode to charge through the circuit means and said transistor means during retrace, and to discharge through the capacitor means, therby providing a voltage source in addition to the feedback signal for improving both the linearity and the stability of the sawtooth wave.

References Cited

UNITED STATES PATENTS

| | | | |
|---|---|---|---|
| 2,594,513 | 11/1950 | Stocker | 315—29 |
| 3,273,007 | 9/1966 | Schneider. | |

RODNEY D. BENNETT, Jr., Primary Examiner

J. G. BAXTER, Assistant Examiner

U.S. Cl. X.R.

315—27